United States Patent
Rottacker et al.

(10) Patent No.: US 7,240,259 B2
(45) Date of Patent: Jul. 3, 2007

(54) PIN COUPLER FOR AN INTEGRATED CIRCUIT TESTER

(75) Inventors: Markus Rottacker, Stuttgart (DE); Joachim Moll, Herrenberg (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 257 days.

(21) Appl. No.: 11/117,968

(22) Filed: Apr. 29, 2005

(65) Prior Publication Data

US 2005/0246603 A1 Nov. 3, 2005

(51) Int. Cl.
G01R 31/28 (2006.01)

(52) U.S. Cl. .................................. 714/724

(58) Field of Classification Search ............... None
See application file for complete search history.

(56) References Cited

U.S. PATENT DOCUMENTS

| | | | | |
|---|---|---|---|---|
| 4,972,413 A | * | 11/1990 | Littlebury et al. | 714/724 |
| 4,989,209 A | * | 1/1991 | Littlebury et al. | 714/724 |
| 5,453,995 A | | 9/1995 | Behrens | |
| 5,499,248 A | | 3/1996 | Behrens et al. | |
| 5,677,916 A | * | 10/1997 | Nozuyama | 714/733 |

FOREIGN PATENT DOCUMENTS

| | | |
|---|---|---|
| DE | 10147298 A2 | 5/2002 |
| EP | 0637137 A2 | 2/1995 |
| EP | 0859318 A1 | 8/1998 |
| EP | 0864977 A1 | 9/1998 |
| EP | 0882991 A1 | 12/1998 |
| EP | 0886214 A1 | 12/1998 |
| EP | 1213870 A1 | 6/2002 |
| WO | WO 00/25144 | 5/2000 |

OTHER PUBLICATIONS

Cai Y. et al. "Digital Serial Communication Device Testing and Its Implications on Automatic Test Equipment Architecture", Proceedings of the International Test Conference, IEEE US, Oct. 30, 2003, pp. 600-609.

Napier T. Ed, "Validating and characterizing high speed datacom devices", International Manufacturing Technology Symposium, IEEE US, Jul. 16, 2003, pp. 221-224.

Masaya Tamamura et al., "4 GB/S ECL Gate Masterslice", Proceedings of the Custom Intergrated Circuits Conference, IEEE US, May 15, 1989, pp. 1481-1484.

EP Search Report, Oct. 11, 2004.

* cited by examiner

*Primary Examiner*—Christine T. Tu
(74) *Attorney, Agent, or Firm*—Perman & Green, LLP

(57) ABSTRACT

A coupling unit that couples at least two pins of an ATE (Automated Test Equipment) to a pin of a device under test includes an ATE interface for receiving a plurality of first stimulus signals from selected ATE-pins and/or for sending a plurality of first response signals to the selected ATE-pins, a DUT interface for sending a second stimulus signal to the DUT-pin and/or for receiving a second response signal from the DUT-pin, and a multiplexer circuit for serializing data of the plurality of first stimulus signals into the second stimulus signal and/or a de-multiplexer circuit adapted for parallelizing data of the second response signal into the plurality of first response signals.

15 Claims, 5 Drawing Sheets

PIN COUPLER FOR AN INTEGRATED CIRCUIT TESTER

BACKGROUND OF THE INVENTION

The present invention relates to testing of integrated circuits with an automated test equipment.

Integrated Circuits (IC) generally need to be tested to assure proper operation. This—in particular—is required during IC development and manufacturing. In the latter case, the ICs are usually tested before final application. During test, the IC, as a device under test (DUT), is exposed to various types of stimulus signals, and its responses are measured, processed and usually compared to an expected response of a good device. Automated test equipment (ATE) usually performs these tasks according to a device-specific test program.

ATEs based various architectures have been applied for testing integrated circuits. For testing complex high speed circuits, ATEs with decentralized resources based on a per-pin architecture are known, wherein during test, each pin of a multiple of the pins of the DUT that are relevant for a test, is connected to one of a multiple the ATE pin electronic. Such an ATE further comprises central resources, in particular for controlling the sequence and timing of applied test stimulus vectors. The per-pin architecture generally enables high performance and scalability. Examples for ATEs with per-pin architecture are the Agilent 83000 and 93000 families of Semiconductor Test Systems of Agilent Technologies. Details of those families are also disclosed e.g. in EP-A-859318, EP-A-864977, EP-A-886214, EP-A-882991, U.S. Pat. No. 5,499,248, U.S. Pat. No. 5,453,995.

Processor speed of integrated circuits or systems integrated on a chip is continuously increasing. For testing those circuits or systems, it is necessary to provide automatic test equipment that is able to cope with the speed demands. However, raising data rates of current ATEs is not possible without a fundamental architectural redesign.

SUMMARY OF THE INVENTION

It is an object of the present invention to provide an improved device performing DUT tests.

The object is solved by the independent claims. Preferred embodiments are shown by the dependent claims.

The idea of the invention is to provide a coupling circuit for coupling a plurality of ATE-pins of an ATE to one DUT pin. Therefore, the corresponding ATE stimulus signals provided by the ATE pins are multiplexed into a stimulus signal, and/or de-multiplexing a response signal provided from the DUT-pin into a plurality of de-multiplexed response signals, thus parallelizing the data of the response signal.

The invention thus allows for raising significantly the test data rate of existing testers without substantially changing the architecture or technology of the testers. Raising the test data rate can be simply achieved by additionally, providing a pin coupler for serializing and or parallelizing the test data and thus multiplying the data rate of existing testers.

Embodiments of the invention are advantageously employed in a tester for parallel testing a multiple of independently accessible cores (DUT-cores) within a system on a chip (SOC), wherein only one or a limited number of the multiple DUT-cores requires testing with ultra high data rates.

In an embodiment of the invention, the coupling circuit further receives a reference clock signal from a selected ATE-pin.

In a further embodiment of the invention, a clock circuit compares the phase of the reference clock signal with the phase of a further clock signal, said further clock signal having a frequency corresponding to the data rate of the second stimulus and/or response signal at the DUT-pin and said frequency being a multiple of the frequency of the reference clock signal. Depending on a comparison result, a retiming clock signal is generated by adjusting the phase of the further clock signal to the phase of the reference signal.

In a further embodiment of the invention, the coupling circuit comprises a frequency dividing circuit for generating a divided clock signal by dividing the frequency of the retiming clock signal down the frequency of the reference clock signal and wherein a phase comparing circuit compares the phases of the reference clock signal and the divided clock signal and generates a phase difference signal depending on the phase difference of said clock signals.

In yet a further embodiment of the invention, the synchronizing circuit comprises transfer elements or flip-flops for buffering, i.e. for short time storing and forwarding the data of the first stimulus data to a multiplexer circuit and wherein said transfer elements have trigger inputs for receiving the reference clock.

In a further embodiment, two of said transfer elements are adapted for storing the data of a stimulus signal received at one ATE-pin, wherein a first of said transfer elements serves for storing the data of said ATE-pin on the occurrence of a rising edge of the reference clock signal and a second of said transfer elements is serves for storing the data of said ATE-pin on the occurrence of a falling edge of the reference clock signal.

In a further embodiment, the synchronizing circuit comprises a plurality of transfer elements for buffering the data received from the de-multiplexing circuit to be forwarded to the ATE and wherein said transfer elements have trigger inputs for receiving the reference clock.

In yet a further embodiment, two of said transfer elements serve for storing the data of a response signal to be forwarded to one ATE-pin, wherein a first of these transfer elements serves for storing the data to said ATE-pin on the occurrence of a rising edge of the reference clock signal and a second of these transfer element serves for storing the data of said ATE-pin on the occurrence of a falling edge of the reference clock signal.

In a further embodiment, the coupling unit is further adapted for tracking the phase difference between data of the second response signal and the retiming clock signal.

In a further embodiment, a jitter insertion circuit is comprised that is connected in front of the output to the DUT. The jitter insertion circuit comprises a first input for receiving a first jitter modulation signal and a second input for receiving a second jitter modulation signal. The jitter insertion circuit generates a time jitter with a jitter distribution corresponding to the amplitude distribution of the first jitter modulation signal and a gain defined by the second modulation signal.

In a further embodiment, a plurality of the jitter insertion circuits are connected in series and each controlled by said first and second jitter modulation signal thus allowing for significantly increasing (i.e. multiplying) the jitter modulation depth.

In a further embodiment, a threshold circuit is comprised for generating either a first voltage representing a logical "0" or generating a second voltage representing a logical "1"

depending on whether the second response signal received from the DUT is above or below a defined threshold value. These values are read at the rate of the retiming clock and buffered into a flip-flop.

In a further embodiment, the coupling unit forms part of an automated test equipment with a plurality of ATE pins being adapted for testing a DUT by emitting first stimulus signals to at least one DUT-pin and/or receiving first response signals from at least one DUT-pin.

In a further embodiment, the invention utilizes an ATE with a so-called tester-per-pin decentralized architecture having multiple individual per-pin testing units, wherein the per-pin testing unit of the ATE each addresses just one pin of a DUT and thus having each a test pattern memory and a test data sequencer.

The invention however might also be used in an ATE with mainly or only centralized resources.

The term 'ATE-pin' as used here shall not only mean an electrical contact of the ATE, but shall also mean a per-pin testing unit or channel, comprising resources for generating stimulus signals or receiving and evaluating response signals. Accordingly, the term 'DUT-pin' as used herein shall not only mean an electrical contact of the DUT, but shall also include the respective functionality of the DUT accessible through that DUT-pin.

It is clear that the invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

DETAILED DESCRIPTION OF THE INVENTION

Figure 1:
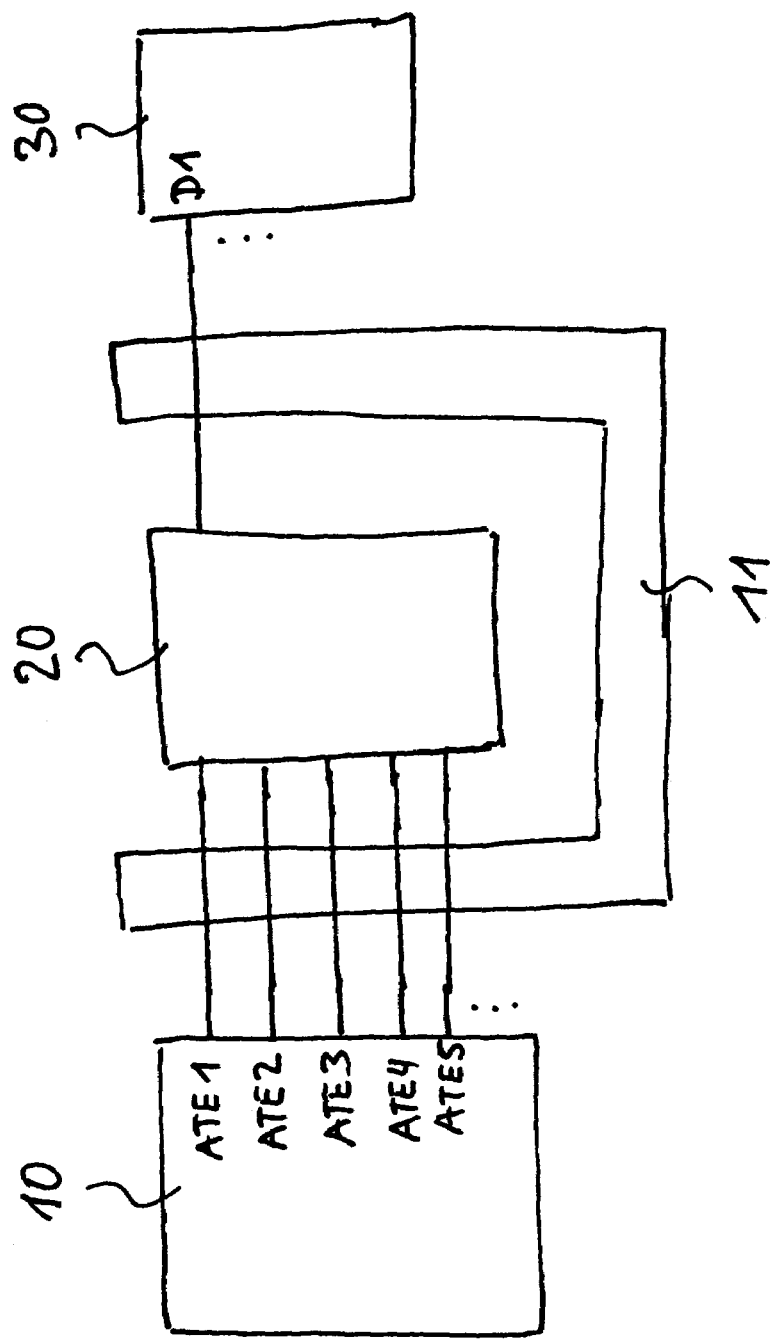
FIG. 1 shows an overview block diagram with an ATE, a DUT and an ATE channel coupler according to the present invention connected together.

FIG. 1 shows an ATE 10 having a number of channels or pins, further referred to as ATE-pins, whereof by way of example five ATE-pins ATE1-ATE5 are connected to a channel coupler 20. The channel coupler 20 is further coupled to one pin D1 of a plurality of pins of a DUT, further referred to as DUT-pins. The ATE-pins as well as the DUT-pins are guided over a load board 11 serving as a physical interface between the. ATE 10 and the DUT 30. This load board 11 may be part of the ATE 10. In the following figures, different embodiments of the channel coupler are discussed in more details.

Figure 2:
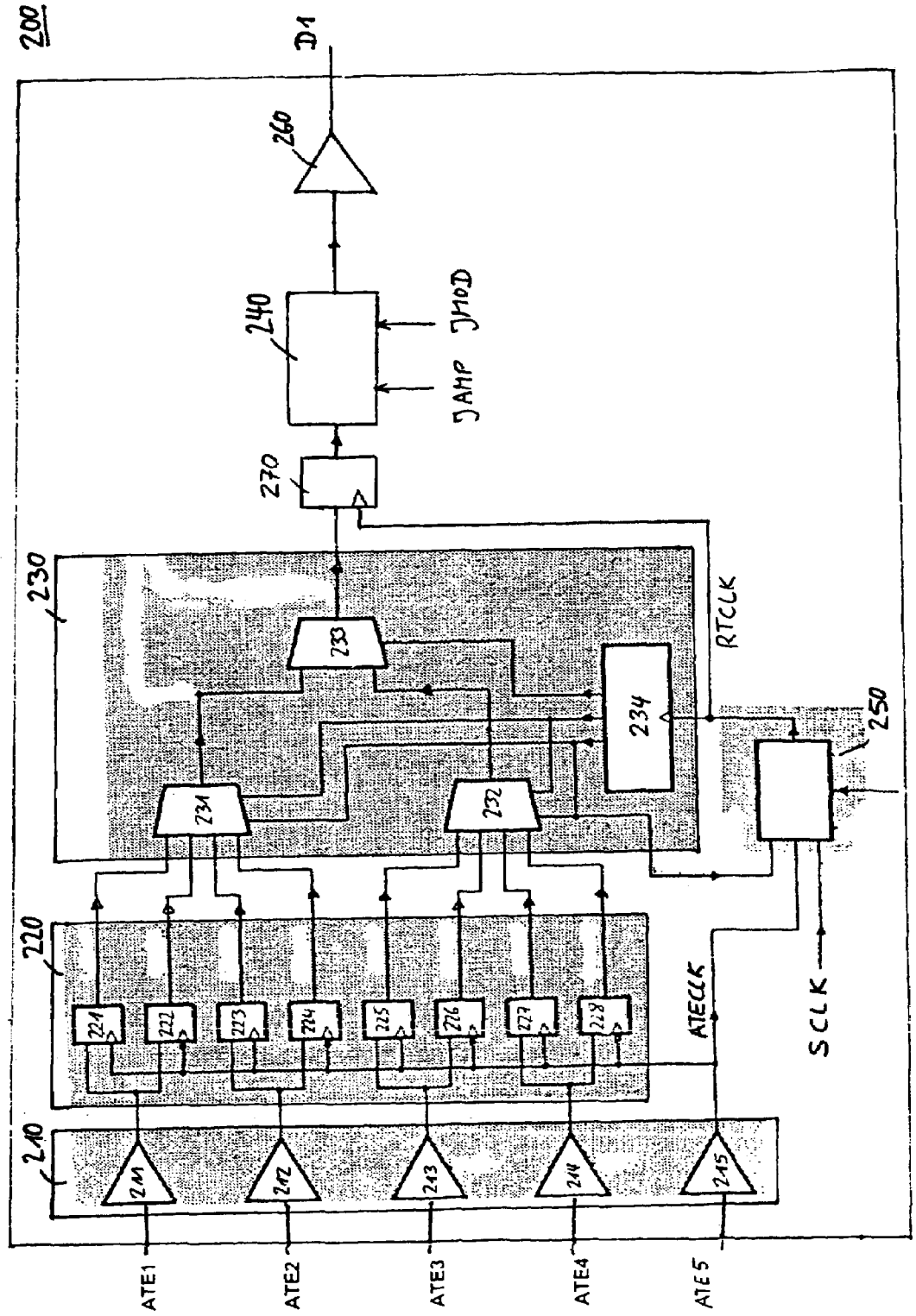
FIG. 2 shows a detailed block diagram for a first embodiment of a channel coupler for serializing incoming data received from a plurality of ATE-pins and to be provided to a DUT-pin.

FIG. 2 shows a first embodiment of a channel coupler for serializing stimulus data received from ATE-pins, further referred to as channel serializer 200. ATE1-ATE4. Channel serializer 200 comprises an ATE Interface 210, a serializer synchronizing circuit 220, a multiplexing circuit 230, a high-speed transfer element or flip-flop 270, a serializer clock circuit 250, a jitter insertion circuit 240 and a DUT interface 260. ATE interface 210 comprises drivers 211-215 each connecting one ATE-pin ATE1-ATE4 to the data inputs of a pair of two single edge-triggered transfer elements or flip-flops 221-228 comprised by the serializer synchronizing circuit 220 and connecting the fifth ATE-pin ATE5 to the trigger inputs of the flip-flops 221-228, marked each by an arrow, and to clock circuit 250. The trigger inputs of the flip-flops from top to down are antivalent, being symbolized by a dot in front of every second trigger input. Clock circuit 250 receives a reference clock (signal) ATECLK from fifth ATE-pin ATE5 and a high-speed generator clock (signal) SCLK from an internal or external clock signal generator not shown in the figure. Clock circuit 250 generates a serializer retiming clock (signal) RTCLK, further referred to under this figure as retiming clock RTCLK, provided to the trigger input of flip-flop 270 and to a (clock frequency) divider 234 of multiplexing circuit 230, the divider generating a set of three trigger signals for triggering multiplexer circuit 230. Divider 234 is described in more details under FIG. 4.

Multiplexing circuit 230 further comprises a first multiplexer 231 receiving the output signals of the first four flip-flops 221-224 and a second multiplexer 232 receiving the output signals of the next four flip-flops 225-228. The outputs of these multiplexers are connected to the inputs of a third multiplexer 233, the output of which is connected to the data input of flip-flop 270. The output of flip-flop 270 is connected to the data input of jitter insertion circuit 240. The output of the jitter insertion circuit 240 is connected to an output driver serving as DUT interface 260 interfacing said jitter insertion circuit output to a DUT-pin D1 of a DUT not shown in the figure.

ATE Interface 210 electrically terminates ATE-pins ATE1-ATE5. The ATE interface 210 may further comprise protection means to withstand faulty ATE port configuration.

Parallelizer synchronizing circuit 220 stores the data provided by ATE-pins ATE1-ATE4 at points of time determined by reference clock ATECLK into intermediate buffers, thus logically terminating ATE-pins ATE1-ATE4. The time points at which the multiplexing unit 230 reads this data out are determined by retiming clock RTCLK provided by the clock circuit 250, that has no fix phase relation to reference clock ATECLK. Further details of clock circuit 250 are described under FIG. 4. In each pair of flip-flops, the first flip-flop is triggered on the occurrence of a rising edge and the second flip-flop is triggered on the occurrence of a falling edge of the reference clock ATECLK. The flip-flops 221-228 are single edge flip-flops, triggered alternately from top to down on the rising and on the falling edge of reference clock ATECLK. Accordingly, the frequency of reference clock ATECLK corresponds to half the data rate of the stimulus signals provided by ATE-ports AT1-ATE4.

Thus, on an occurrence of a rising edge of reference clock ATECLK, e.g. at a time T0, flip-flops 221, 223, 225 and 227 store the actual values of the stimulus signals provided by ATE-pins ATE1-ATE4. On the occurrence of the next falling edge of reference clock ATECLK at a time DT after T0, flip-flops 222, 224, 226 and 228 store the next actual values of the stimulus signals provided by ATE-pins ATE1-ATE4, wherein time DT corresponds to the data rate of stimulus signals provided by ATE-pins ATE1-ATE4.

Multiplexing circuit 230 serializes the data stored in the, buffers of the synchronization circuit 220. Divider 234 provides a set of three different clock signals, wherein a first clock signal has a divided-by-two frequency, a second clock divided-by-four frequency and a third clock has a divided-by-eight frequency compared to the frequency of retiming clock RTCLK. Selected of these clock signals are provided to multiplexers 231, 232 and 233 serving as trigger signals. First (4:1) multiplexer 231 generates a signal combining the received data of the first two ATE-pins ATE1 and ATE2. Second (4:1) multiplexer combines the received data of the third and fourth ATE-pins ATE3 and ATE4. Third (2:1) multiplexer 233 receives the each combined data from the first and the second multiplexers 231 and 232 and further combines these data signal into a data signal comprising the data of all four ATE-pins ATE1-ATE4, wherein this signal shows a data rate of four times of the data rate of the data provided by each ATE-pin.

Multiplexing circuit 230 utilizes a set of trigger signals derived from a high-speed clock generator. Clock circuit 250 therefore generates retiming clock RTCLK by aligning the phase of the clock generator signal SCLK to the phase of the rather low frequency reference clock ATECLK.

High-speed flip-flop 270 stores the data stream generated by multiplexing circuit 230 in its intermediate buffer and forwards the buffered data at a data rate determined by the frequency of retiming clock RTCLK to jitter insertion circuit 240.

Jitter insertion circuit 240 inserts a tunable delay to the signal received from the multiplexing circuit 230. The delay is modulated with a first modulation signal JMOD and a second modulation signal JAMP. The output of jitter insertion circuit 240, shows a time jitter equal to the amount of delay variation, with a jitter distribution corresponding to the amplitude distribution of JMOD. The gain of first modulation signal JMOD input is adjusted with second modulation signal JAMP.

To enhance the maximal jitter modulation depth, two or more jitter modulators 240 can be connected in series, commonly controlled by the modulation signals JMOD and JAMP.

If no jitter is to be inserted into the output signal, the jitter insertion module might be powered down. A bypass might be switched for forwarding the data signal directly from flip-flop 270 to DUT interface 260.

DUT interface 260 electrically terminates the DUT-pins. The output driver shapes the data received from DUT-pin D1 according to a set of different parameters, e.g. high voltage level, low voltage level and rise/fall time. The output driver might additionally be selected to invert its polarity.

Alternatively to the embodiment shown in FIG. 2, reference clock ATECLK may have the double frequency thus corresponding to the data rate of the stimulus signals. Instead of eight flip-flops 221-228, a set of four singe-edge flip-flops may be provided for storing the bit information (data) of the stimulus signals with double speed compared to the embodiment described above. As consequence, only one 4:1 multiplexer or two 1:2 multiplexers are necessary for multiplexing the data provided by these flip-flops.

Further alternatively, single edge flip-flops 221-228 are replaced by a set of four dual edge flip-flops, The clock frequency of the ATE clock then is corresponds to haft the data rate of the data rate of the data provided by the TE-pins and is thus similar to the embodiment shown in FIG. 2.

Figure 3:
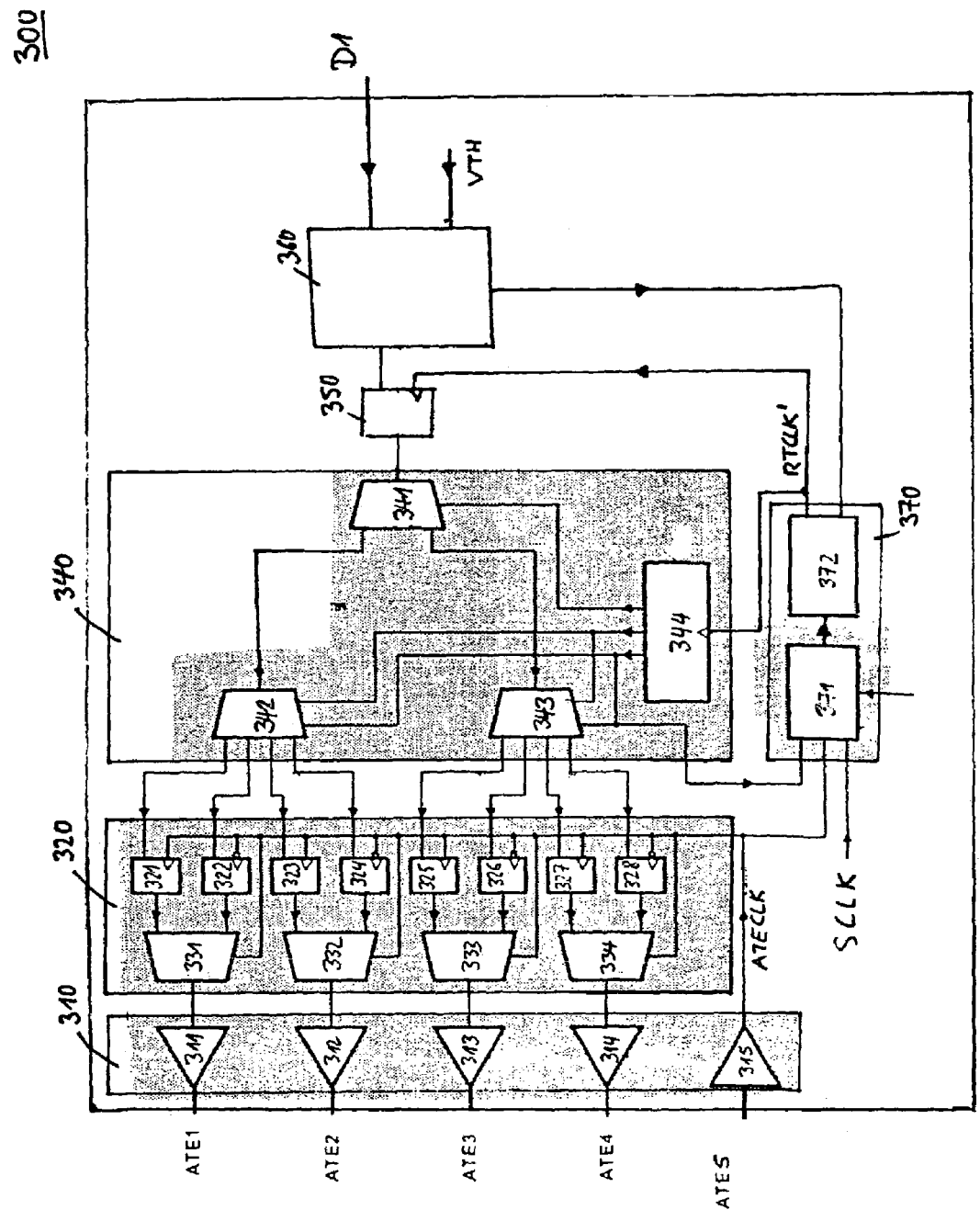
FIG. 3 shows a detailed block diagram for a second embodiment of a channel coupler for parallelizing data received from a DUT-pin and to be provided to a plurality of ATE-pins.

FIG. 3 shows a second embodiment of a channel coupler adapted for working in the opposite direction compared to the channel serializer 200 shown in FIG. 2 and described above. The channel parallelizer 300 comprises a comparator 360, a high-speed flip-flop 350, a de-multiplexer circuit 340, a Parallelizer synchronizing circuit 320, an ATE-interface 310 and a parallelizer clock circuit 370. Comparator 360 is connected to the DUT-pin D1 receiving a high-speed response data signal from the DUT not shown in FIG. 3. ATE channels ATE1-ATE5 are again located on the left, whereas the DUT-pin is again located right. The signals flow is now mainly in the opposite direction, i.e. from the right side to left side. The signal flow is marked with arrows at the corresponding connections. However, similarly to FIG. 2, the fifth ATE channel ATE5 is again used for providing reference clock ATECLK to the channel coupler.

Comparator 360 receives at its inputs the high-speed data signal from DUT-pin D1 as well as a threshold value VTH. The data output of comparator 360 is connected to the data input of high-speed flip-flop 350. Further, comparator 360 provides timing information TRD to clock circuit 370. The trigger input of high-speed flip-flop 350 is connected to the clock circuit 370 receiving parallelizer retiming clock (signal) RTCLK'. The output of flip-flop 350 is connected to de-multiplexing unit 340 and. De-multiplexing circuit 340 comprises a first de-multiplexer 341 with its input connected to the output of high-speed flip-flop 350. First multiplexer 341 shows two outputs, each of them connected to a second de-multiplexer 342 and a third de-multiplexer 343 respectively. De-multiplexing circuit 340 further comprises a divider 344 that is similar to divider 234 of FIG. 2. Divider 344 shows one input for receiving a parallelizer clock RTCLK' and three outputs for providing de-multiplexer trigger clock signals with different frequencies.

Comparator 360 receives a high-speed data signal from DUT-pin D1. The amplitude of this signal is compared with threshold value VTH. Depending on whether the actual amplitude is above or below the threshold value, comparator 360 provides an output signal representing a logical "1" or an output signal representing a logical "0" respectively.

High-speed flip-flop 350 buffers and forwards the output signal of comparator 360 at a rate defined by parallelizer clock RTCLK' to de-multiplexing circuit 340.

De-multiplexing unit 340 splits the high-speed data signal received from high-speed flip-flop 350 into eight parallel branches. Divider 344 provides a set of three synchronized clock signals with each a different frequency to be provided to de-multiplexers 341, 342 and 343. First (2:1) de-multiplexer 341 alternately forwards the received data to second and third de-multiplexer 342 and 343. These de-multiplexers 342 and 343 parallelize the each received data into each four data signal provided to synchronization circuit 320.

Parallelizer synchronization circuit 320 comprises a set of eight single edge flip-flops 321-328 that buffers the values of the eight data signals provided by the de-multiplexing unit 340, each triggered by (slow) reference clock ATECLK. Similarly to the flip-flops of serializer synchronization circuit described above, each two flip-flops from top to down from a pair of flip-flops, the first flip-flop being triggered on the occurrence of a rising edge and the second flip-flop being triggered on the occurrence of a falling edge of the reference clock ATECLK. De-multiplexing circuit 320 further comprises a set of four multiplexers 331-334 that each (re-)combine the output data of two flip-flops forming a pair of flip-flops described above, thus generating a set of four parallel data signals that are further provided to parallelizer ATE interface 310.

Parallelizer clock circuit 370 comprises a phase adjustment circuit 371 and a delay tracking circuit 372. These circuits are substantially physically similar, each comprising a tunable delay line, wherein both first and second delay lines are connected in series. Phase adjustment circuit 371 tracks the phase difference between reference clock ATE-CLK and the third output of divider 344 representing parallelizer clock RTCL' with a divided-by-eight frequency and sets the first delay line. Delay tracking circuit 372 tracks the phase of the incoming high-speed response data from DUT-pin D1 and sets the second delay line. Generator clock SCLK from a clock generator described under FIG. 2 and not shown here is provided to the input of said connected delay lines. The output of said connected delay lines provides parallelizer retiming clock RTCLK'.

Instead of using only one comparator as shown in FIG. 3, comparator circuit 360 might alternatively comprise a set of different comparators. These comparators might include one or more differential comparators, receiving to two complementary input signals INp and INn from the DUT.

In one alternative, comparator circuit 360 specifically comprises five comparators, wherein one differential comparator compares INp to INn. Two single ended comparators are used to compare either INp or INn with a defined threshold value. The fourth comparator compares the common mode of the differential input INp and INp with the threshold. Depending on a selection signal, one of these four comparators is selected to provide the signal to the de-multiplexer circuit 340. The fifth comparator is also a differential comparator, which is used to generate the timing information provided to the delay tracking circuit 372.

Alternatively, clock circuit 370 only comprises a phase adjustment circuit according to serializer clock circuit 250 without any means for tracking the phase of the incoming signal from the DUT.

De-multiplexer circuit 340 is alternatively realized by a one-to-four (1:4) de-multiplexer device or by a circuit of three one-to-two (1:2) de-multiplexers generating four parallel data signals. These four data signal are then provided to four flip-flops working on a trigger rate corresponding to the double frequency compared to the frequency of the reference clock ATECLK.

The embodiments described under FIG. 2 and FIG. 3 are preferably integrated into one physical unit, this unit e.g. forming an upgrade card for current ATE's. This card can be easily connected to the load board of the ATE. This upgrade card allows for re-using as much as possible of the built-in software of existing testers, i.e. the high-speed measurements are projected on existing ATE channels.

The data rate of the stimulus and/or response data at ATE-pins ATE1-ATE4 is by way of example 3.2 Gigabit per second (Gbps). The frequency of reference clock ATECLK provided at ATE5 then is 1.6 Gigahertz (GHz). Accordingly, the frequency of serializer retiming clock RTCLK and/or parallelizer retiming clock RTCLK' has to be 12.8 GHz and high speed stimulus and/or response data at DUT-pin D1 show a data rate of 12.8 Gbps. As a matter of course, the data rates of the stimulus and response data are arbitrarily scalable.

Figure 4:
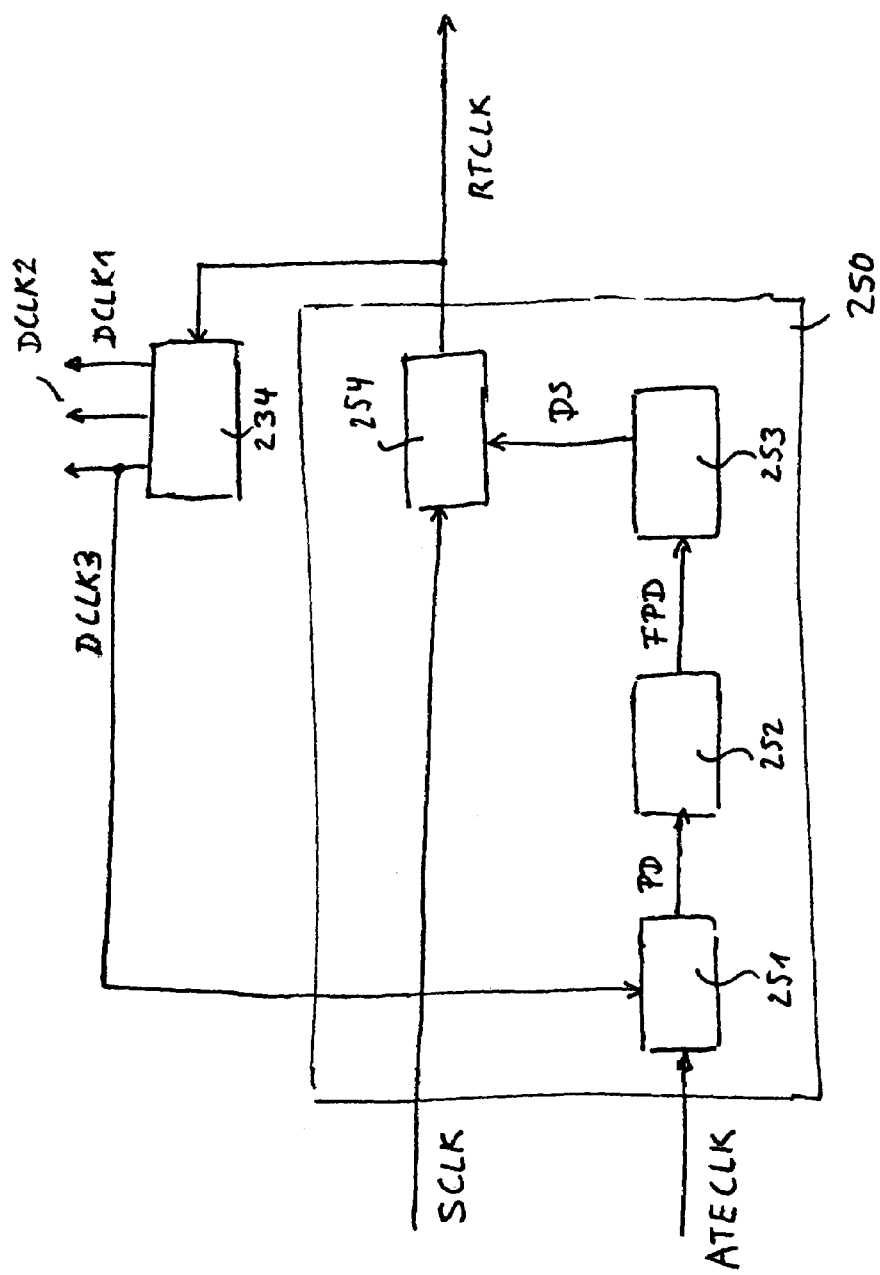
FIG. 4 shows an exemplary block diagram of a clock signal generator for generating clock signals to be used in the channel coupler according to FIG. 2 or FIG. 3.

FIG. 4 shows an exemplary block diagram of serializer clock circuit 250 of FIG. 2. Clock circuit 250 comprising a phase detector 251, a low pass filter 252, a control unit 253 and a tunable delay line 254. Further, divider 234 of FIG. 2 is shown.

Phase detector 251 receives reference clock ATECLK and generator clock SCLK provided by a clock generator mentioned under FIG. 2. Both clock signals have the same frequency but are not necessarily phase aligned. Phase detector 251 determines the phase difference and provides a phase difference signal PD to low pass filter 252. Low pass filter 252 cuts off high frequencies of the received signal and provides a smoothed phase difference signal FPD to control unit 253. Control unit 253 determines a delay setting value DS that is provided to tunable delay 254. Tunable delay sets its delay according to the received delay setting value. Delay setting can e.g. be performed by switching different fixed delay lines together. Depending on the delay set, the phase of high-speed generator clock SCLK is shifted thus generating retiming clock RTCLK.

Retiming clock RTCLK is provided to divider 254 that generates a set of further clock signals DCLK1-DCLK3. Divider 254 operates in a divide-by-8 mode, therefore comprises a set of three divide-by-two circuits connected to each other in series. First divided clock signal DCLK1 is generated by first divide-by-two circuit thus showing half the frequency of retiming clock signal RTCLK. Second divided clock signal DCLK2 is generated by second divide-by-two circuit thus showing a quarter of the frequency of retiming clock RTCLK. Third divided clock signal DCLK3 is generated by third divide-by-two circuit thus showing an eighth of the frequency of retiming clock RTCLK.

As described above, third divided clock signal DCLK3 shows the same frequency as reference clock signal ATE-CLK. This clock signal is feed back to phase detector 251. At powering on, both clock signals usually will not be aligned to each other. Control unit 253 will vary the delay of tunable delay line 254 as long as a defined phase delay (e.g. phase delay=0) between the clock signals is achieved.

Control unit 253 either form part of coupling circuit 200 or is a separate unit outside coupling circuit 200.

Figure 5A:
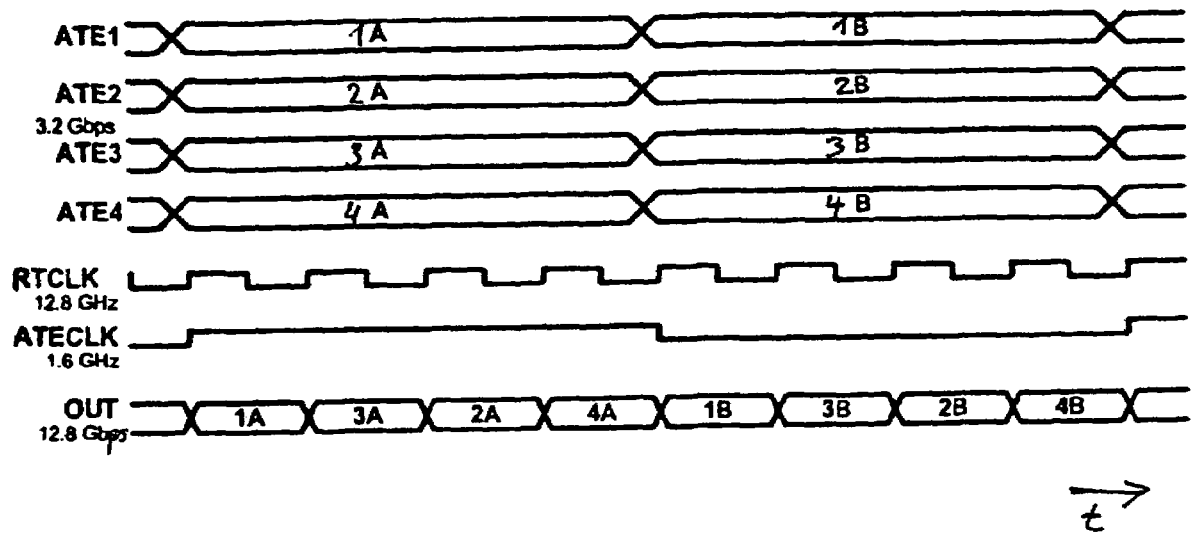
FIG. 5a shows an exemplary timing diagram, wherein the data of four ATE-pins is serialized

FIG. 5a shows a timing diagram according to the channel serializer shown in FIG. 2, showing from top to down stimulus data signals for ATE-pins ATE1-ATE4, retiming clock RTCLK, reference clock ATECLK and output signal OUT. Stimulus data provided by first ATE-pin ATE 1 shows data 1A and 1B, stimulus data provided by second ATE-pin ATE 2 shows data 2A and 2B, stimulus data provided by third ATE-pin ATE 3 shows data 3A and 3B, and stimulus data provided by fourth ATE-pin ATE 4 shows data 4A and 4B. The data rates are each 3.2 Gbps. Retiming clock RTCLK has rectangular form with balanced duty cycle showing a frequency of 12.8 GHz. Reference clock ATE-CLK has rectangular form with balanced duty cycle showing a frequency of 1.6 GHz. The output signal shows a data rate of 12.8 Gbps, wherein the data of the four ATE-pins are serialized as follows: 1A, 3A, 2A, 4A, 1B, 3B, 2B, 4B.

Figure 5B:
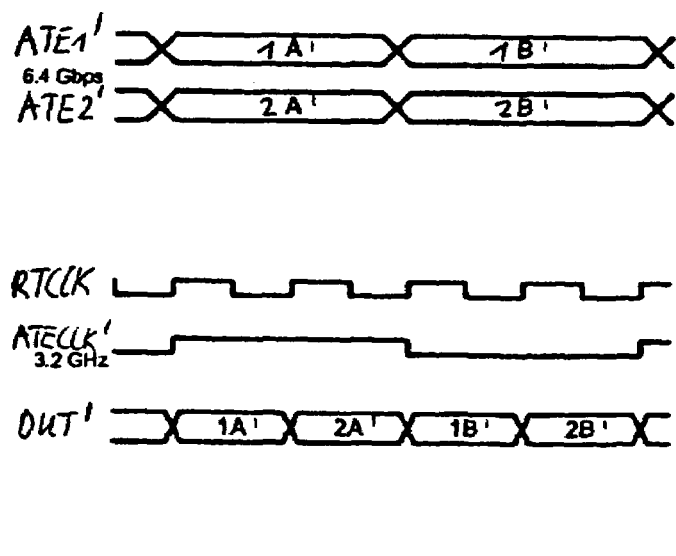
FIG. 5b shows an exemplary timing diagram, wherein the data of two ATE-pins is serialized.

FIG. 5b shows a timing diagram for an alternative channel serializer for two ATE channels ATE1' and ATE2' providing a first stimulus signal with data 1A', 1B' and a second stimulus signal with data 2A', 2B' respectively, each having a data rate of 6.4 Gbps. Retiming clock RTCLK is similar to retiming clock of FIG. 5a. A reference clock ATECLK' shows a rectangular signal with a frequency of 3.2 GHz. The output signal OUT' shows a data rate of 12.8 Gbps serializing the data as follows: 1A', 2A', 1B', 2B'.

It is clear from the above description, that the invention allows for coupling any arbitrary number of ATE-pins to one DUT-pin. It is also possible to provide a coupler according to the invention with a switch for changing the number of ATE-pins to be coupled to the DUT-pin. Such a switch may send switch signals to the clock circuit for changing the clock frequency, to a dividing circuit for generating appropriate divided clock signals and to the multiplexers of the multiplexing unit for changing the multiplexing scheme.

What is claimed is:

1. A coupling unit being adapted for coupling at least two ATE-pins of an automated test equipment—(ATE)— to a (DUT)-pin of a device under test—(DUT)—, comprising:
   an ATE interface adapted for at least one of: receiving a plurality of first stimulus signals from one or more of the ATE-pins and sending a plurality of second response signals to the ATE-pins,
   a DUT interface adapted for at least one of: sending a second stimulus signal to the DUT-pin and receiving a first response signal from the DUT-pin and
   at least one of: a multiplexer adapted for serializing data of the plurality of first stimulus signals into the second stimulus signal and a de-multiplexer circuit adapted for parallelizing data of the second response signal into the plurality of second response signals, and
   a clock circuit adapted for receiving a reference clock signal from a further ATE-pin and a further clock signal, and for generating a retiming clock signal by adjusting the phase of the further clock signal on the base of a comparison of the reference clock signal and a further clock signal.

2. The coupling unit of claim 1, wherein said further clock signal shows a frequency corresponding to the data rate of the second stimulus and/or response signal at the DUT-pin and said frequency is a multiple of the frequency of the reference clock signal.

3. The coupling unit of claim 1, further comprising a clock divider circuit for generating a divided clock signal by dividing the frequency of the retiming clock signal down the frequency of the reference clock signal, wherein a phase comparing circuit is comprised adapted for comparing the phases of the reference clock signal and the divided clock signal and for generating a phase difference signal depending on the phase difference of said clock signals and a phase adjusting circuit is comprised for performing the phase adjustment on the base of said phase difference signal.

4. The coupling unit of claim 1, further comprising a synchronizing circuit with transfer elements adapted for buffering the data of the first stimulus signals and transferring said data to the multiplexer circuit and wherein said transfer elements have trigger inputs for receiving the reference clock so that the buffering and forwarding is synchronized to the reference clock.

5. The coupling unit of claim 4, wherein two of said transfer elements are adapted for storing the data of a stimulus signal received at one ATE-pin, wherein a first of said transfer elements is adapted for storing the data of said ATE-pin on the occurrence of a rising edge of the reference clock signal and a second of said transfer elements is adapted for storing the data of said ATE-pin on the occurrence of a falling edge of the reference clock signal.

6. The coupling unit of claim 1, further comprising a synchronizing circuit with transfer elements adapted for buffering the data received from the de-multiplexing circuit to be forwarded to the ATE interface and wherein said transfer elements have trigger inputs for receiving the reference clock.

7. The coupling unit of claim 6, wherein two of said transfer elements are adapted for storing the data of a response signal to be forwarded to one ATE-pin, wherein a first of these transfer elements is adapted for storing the data to said ATE-pin on the occurrence of a rising edge of the reference clock signal and a second of these transfer element the is adapted for storing the data of said ATE-pin on the occurrence of a falling edge of the reference clock signal.

8. The coupling unit of claim 1, wherein the clock circuit is further adapted for tracking the phase difference between data of the second response signal and the retiming clock signal.

9. The coupling unit of claim 1, further comprising a jitter insertion circuit connected between the multiplexing unit and the DUT interface, said jitter insertion circuit comprising a first input for providing a first jitter modulation signal and a second input for providing a second jitter modulation signal and wherein said jitter insertion circuit is adapted for generating a time with a jitter distribution corresponding to the amplitude distribution defined by the first jitter modulation signal and a gain defined by the second modulation signal.

10. The coupling unit of claim 9, wherein a plurality of the jitter insertion circuits is connected in series and each controlled by said first and second jitter modulation signal.

11. The coupling unit of claim 1, further comprising a threshold circuit adapted for generating either a first voltage representing a logical "0" or generating a second voltage representing a logical "1" depending on whether the first response signal is above or below a defined threshold value.

12. An automated test equipment with a plurality of ATE pins being adapted for testing DUT—by emitting first stimulus signals to at least one DUT-pin and/or receiving first response signals from at least one DUT-pin, comprising the coupling unit of claim 1.

13. The automated test equipment of claim 12, wherein the test equipment has a tester per pin architecture with a plurality of per-pin testing units having each a test pattern memory and a test data sequencer.

14. A method of coupling two or more pins of an automated test equipment—(ATE)—, to a device under test—(DUT)—, wherein said (ATE) comprises a plurality of ATE pins being adapted for testing the DUT by emitting stimulus signals to the DUT and/or receiving response signals from the DUT, comprising:
   receiving at least one of: a plurality of first stimulus signals from one of a plurality of the ATE-pins and a first response signal from the DUT-pin,
   at least one of: serializing data of the plurality of first stimulus signals and generating a second stimulus signal with the serialized data sequence and parallelizing data of the second response signal into second response signals,
   transmitting at least one of: the second stimulus signal to the DUT-pin and the plurality of the second response signals to the ATE-pins,
   receiving a reference clock signal from a further ATE-pin and a further clock signal, and
   generating a retiming clock signal by adjusting the phase of the further clock signal on the base of a comparison of the reference clock signal and a further clock signal.

15. A software program or product, stored on a data carrier, for executing in a coupling unit coupling two or more pins of an ATE to a DUT, wherein said ATE comprises a plurality of ATE pins being adapted for testing the DUT by emitting stimulus signals to the DUT and/or receiving response signals from the DUT, comprising:
   receiving at least one of: a plurality of first stimulus signals from one of a plurality of the ATE-pins and a first response signal from the DUT-pin,
   at least one of: serializing data of the plurality of first stimulus signals and generating a second stimulus signal with the serialized data sequence and parallelizing data of the second response signal into second response signals, transmitting at least one of: the second stimulus signal to the DUT-pin and the plurality of the second response signals to the ATE-pins,
receiving a reference clock signal from a further ATE-pin and a further clock signal, and generating a retiming clock signal by adjusting the phase of the further clock signal on the base of a comparison of the reference clock signal and a further clock signal.

* * * * *